(12) United States Patent
Tanaka

(10) Patent No.: US 9,746,490 B2
(45) Date of Patent: *Aug. 29, 2017

(54) PHYSICAL QUANTITY SENSOR, ELECTRONIC APPARATUS, AND MOVING BODY

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 119 days.

This patent is subject to a terminal disclaimer.

(21) Appl. No.: 14/817,324

(22) Filed: Aug. 4, 2015

(65) Prior Publication Data

US 2016/0047837 A1 Feb. 18, 2016

(30) Foreign Application Priority Data

Aug. 13, 2014 (JP) ................................. 2014-164907
Jun. 5, 2015 (JP) ................................. 2015-114927

(51) Int. Cl.
*G01P 15/125* (2006.01)
*G01C 19/56* (2012.01)
*G01C 19/5719* (2012.01)
*B81B 3/00* (2006.01)
*G01P 15/08* (2006.01)

(52) U.S. Cl.
CPC .......... *G01P 15/125* (2013.01); *B81B 3/0013* (2013.01); *G01C 19/5719* (2013.01); *B81B 2201/0235* (2013.01); *B81B 2201/0242* (2013.01); *B81B 2201/033* (2013.01); *B81B 2207/097* (2013.01); *B81C 2203/0109* (2013.01); *B81C 2203/031* (2013.01); *G01P 2015/0814* (2013.01)

(58) Field of Classification Search
CPC .... G01P 15/125; G01P 15/0802; G01P 15/18; G01C 19/5719; G01C 19/5755
See application file for complete search history.

(56) References Cited

U.S. PATENT DOCUMENTS 5,511,420 A * 4/1996 Zhao ..................... G01P 15/125
73/514.18
5,542,295 A 8/1996 Howe et al.
(Continued)

FOREIGN PATENT DOCUMENTS

JP 05-304303 A 11/1993
JP 07-333078 A 12/1995
(Continued)

*Primary Examiner* — Helen Kwok
(74) *Attorney, Agent, or Firm* — Harness, Dickey & Pierce, P.L.C.

(57) ABSTRACT

A physical quantity sensor includes: a base substrate; a movable portion; a plurality of movable electrode fingers which are provided in the movable portion; a fixed electrode finger which is provided on the base substrate; and a fixing portion which fixes the movable portion to the base substrate. In the movable electrode fingers, a movable electrode finger which opposes the fixing portion in the first direction is included. A clearance between the movable electrode finger and the fixing portion is smaller than a clearance between the movable electrode finger and the fixed electrode finger. The width of the movable electrode finger is greater than the width of other movable electrode finger.

20 Claims, 12 Drawing Sheets

(56) References Cited

U.S. PATENT DOCUMENTS

| | | | |
|---|---|---|---|
| 5,574,222 A | 11/1996 | Offenberg | |
| 5,627,317 A | 5/1997 | Offenberg et al. | |
| 6,065,341 A | 5/2000 | Ishio et al. | |
| 6,170,332 B1 | 1/2001 | MacDonald et al. | |
| 6,171,881 B1 | 1/2001 | Fujii | |
| 6,240,782 B1 | 6/2001 | Kato et al. | |
| 6,272,926 B1 | 8/2001 | Fehrenbach et al. | |
| 6,276,207 B1* | 8/2001 | Sakai | B81B 3/0008 73/514.16 |
| 6,360,604 B1* | 3/2002 | Laermer | G01P 15/125 73/514.38 |
| 6,360,605 B1 | 3/2002 | Pinter et al. | |
| 6,388,300 B1 | 5/2002 | Kano et al. | |
| 6,494,096 B2 | 12/2002 | Sakai et al. | |
| 6,568,267 B2 | 5/2003 | Chida et al. | |
| 6,634,232 B1* | 10/2003 | Rettig | B81B 3/0051 73/514.15 |
| 6,763,716 B2* | 7/2004 | Nagahara | B81B 7/0006 73/493 |
| 6,892,577 B2 | 5/2005 | Nagahara | |
| 6,960,488 B2 | 11/2005 | Brosnihan et al. | |
| 7,243,545 B2 | 7/2007 | Sakai et al. | |
| 7,267,006 B2 | 9/2007 | Malvern | |
| 7,418,864 B2* | 9/2008 | Asami | B81B 3/0086 73/514.32 |
| 7,469,588 B2 | 12/2008 | LaFond et al. | |
| 7,554,340 B2 | 6/2009 | Furukubo et al. | |
| 7,900,515 B2 | 3/2011 | Yamaguchi et al. | |
| 8,289,723 B2 | 10/2012 | Inoue et al. | |
| 8,516,891 B2 | 8/2013 | Zhang et al. | |
| 8,997,569 B2 | 4/2015 | Narita et al. | |
| 2001/0025529 A1* | 10/2001 | Murata | G01C 19/5719 73/514.16 |
| 2002/0011107 A1* | 1/2002 | Sakai | G01P 15/0802 73/514.32 |
| 2002/0025529 A1 | 2/2002 | Quake et al. | |
| 2002/0112538 A1 | 8/2002 | Pinter et al. | |
| 2003/0217597 A1* | 11/2003 | Kumagai | G01P 15/125 73/514.01 |
| 2004/0017209 A1* | 1/2004 | Goto | G01P 15/0802 324/661 |
| 2004/0187571 A1* | 9/2004 | Goto | G01P 15/125 73/504.14 |
| 2004/0187575 A1* | 9/2004 | Murata | G01P 15/125 73/514.16 |
| 2005/0061075 A1* | 3/2005 | Sugiura | G01C 19/5719 73/514.32 |
| 2006/0008935 A1* | 1/2006 | Asai | B81C 1/00626 438/50 |
| 2006/0107742 A1* | 5/2006 | Sakai | G01P 15/125 73/514.32 |
| 2009/0277267 A1* | 11/2009 | Wang | B81C 1/00182 73/514.32 |
| 2010/0050771 A1 | 3/2010 | Je et al. | |
| 2010/0072563 A1 | 3/2010 | Sato et al. | |
| 2011/0120221 A1* | 5/2011 | Yoda | B81B 3/0086 73/514.32 |
| 2011/0290023 A1 | 12/2011 | Takagi | |
| 2012/0111615 A1 | 5/2012 | Yoda et al. | |
| 2013/0074596 A1 | 3/2013 | Takizawa | |
| 2014/0216156 A1 | 8/2014 | Sakai | |
| 2015/0301075 A1 | 10/2015 | Yamanaka et al. | |

FOREIGN PATENT DOCUMENTS

| | | |
|---|---|---|
| JP | 08-043436 A | 2/1996 |
| JP | 08-506857 A | 7/1996 |
| JP | 11-230985 A | 8/1999 |
| JP | 2000-206142 A | 7/2000 |
| JP | 2000-286430 A | 10/2000 |
| JP | 2001-330623 A | 11/2001 |
| JP | 2002-005954 A | 1/2002 |
| JP | 2002-510139 A | 4/2002 |
| JP | 2004-286615 A | 10/2004 |
| JP | 2004-286624 A | 10/2004 |
| JP | 2007-279056 A | 10/2007 |
| JP | 2011-247714 A | 12/2011 |
| JP | 2012-098208 A | 5/2012 |
| JP | 2012-163415 A | 8/2012 |
| WO | WO-94-18697 A1 | 8/1994 |
| WO | WO-99-36941 A2 | 7/1999 |

* cited by examiner

FIG. 3
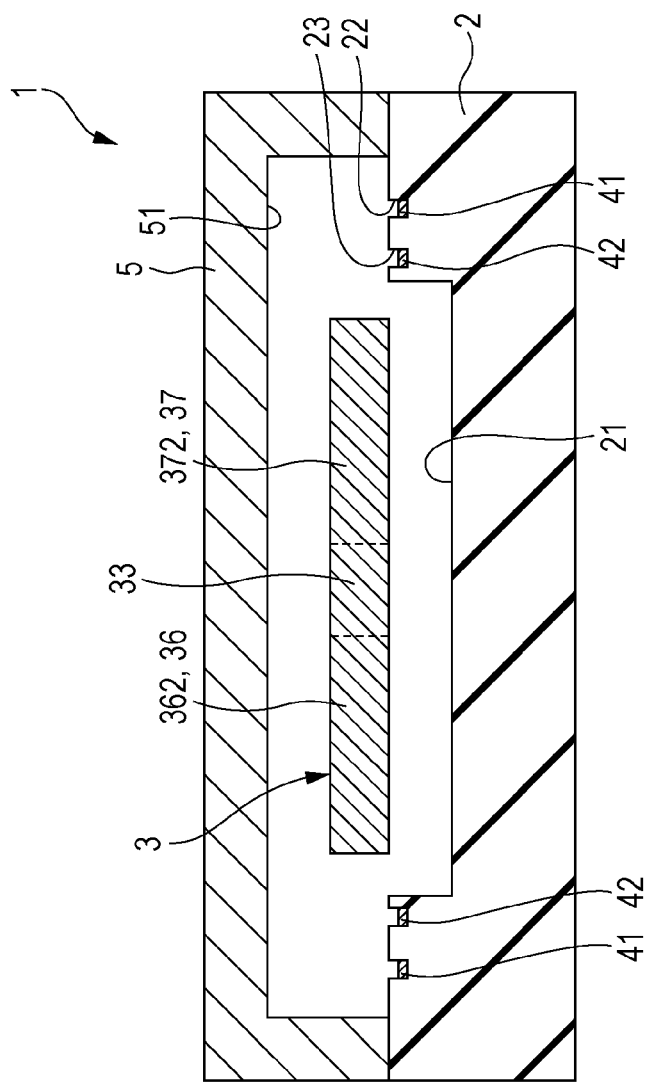
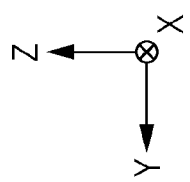

PHYSICAL QUANTITY SENSOR, ELECTRONIC APPARATUS, AND MOVING BODY

BACKGROUND

1. Technical Field

The present invention relates to a physical quantity sensor, an electronic apparatus, and a moving body.

2. Related Art

As a physical quantity sensor, a physical quantity sensor element which includes a fixed electrode disposed to be fixed, and a movable electrode that opposes the fixed electrode while being separated at a certain interval and provided to be displaceable, and detects a physical quantity, such as an accelerating velocity or an angular velocity, based on an electrostatic capacity between the fixed electrode and the movable electrode, is known (for example, refer to Japanese Patent No. 4238437).

For example, the physical quantity sensor element described in Japanese Patent No. 4238437 includes a base plate portion and a beam structure body which is supported by the based plate. The beam structure body includes an anchor portion, a weight portion, a beam portion which links the anchor portion and the weight portion to each other, and a plurality of movable electrodes provided in the weight portion. In addition, the physical quantity sensor element described in Japanese Patent No. 4238437 includes a plurality of fixed electrodes provided to be positioned on both sides of each movable electrode. The physical quantity sensor can measure a change in the electrostatic capacity between the movable electrode and the fixed electrode, and can detect the physical quantity based on the measurement result.

However, in the physical quantity sensor element described in Japanese Patent No. 4238437, since the movable electrode is elongated and the strength thereof is low, there is a concern that the movable electrode comes into contact with the anchor portion and gets damaged when strong stress (impact) is applied.

SUMMARY

An advantage of some aspects of the invention is to provide a physical quantity sensor which is impact resistant and has excellent mechanical strength, and an electronic apparatus and a moving body which are provided with the physical quantity sensor.

The invention can be realized in the following forms or application examples.

Application Example 1

According to this application example, there is provided a physical quantity sensor comprising a base substrate, a movable portion which is displaceable in a first direction with respect to the base substrate, a plurality of movable electrode fingers which are provided in the movable portion, and disposed along the first direction, a fixed electrode finger which is provided on the base substrate, and disposed to oppose the movable electrode finger in the first direction, and a fixing portion which fixes the movable portion to the base substrate that is displaceable in the first direction, in which, in the plurality of movable electrode fingers, a movable electrode finger which opposes the fixing portion in the first direction is included, in which a clearance between the opposing movable electrode finger and the fixing portion in the first direction is smaller than a clearance between the movable electrode finger and the fixed electrode finger in the first direction, and in which the width of the opposing movable electrode finger among the plurality of movable electrode fingers is greater than the width of other movable electrode finger.

Accordingly, it is possible to provide a physical quantity sensor which is impact resistant and has excellent mechanical strength.

Application Example 2

In the physical quantity sensor according to the application example, at least partially at a part which opposes the movable electrode finger of the fixing portion in the first direction, a decreasing portion in which a sectional area decreases toward the movable electrode finger is preferably provided.

Accordingly, while effectively suppressing the fixing portion being stuck to the movable electrode finger, it is possible to manufacture a physical quantity sensor which has excellent mechanical strength.

Application Example 3

In the physical quantity sensor according to the application example, it is preferable that the width of the plurality of movable electrode fingers becomes smaller as being apart from a portion connected with the fixing portion of the movable portion.

Accordingly, while effectively suppressing the movable portion being stuck to the base substrate during the manufacturing, it is possible to manufacture a physical quantity sensor which has excellent mechanical strength.

Application Example 4

In the physical quantity sensor according to the application example, one pair of fixing portions are provided to oppose each other in the first direction via the movable portion, and in which the movable portion is preferably fixed to the one pair of fixing portions in both end portions in the first direction.

Accordingly, the movable portion is fixed to the fixing portion in a more stable state.

Application Example 5

In the physical quantity sensor according to the application example, among the plurality of movable electrode fingers, it is preferable that a movable electrode finger which is positioned on the most end portion side of the movable portion in the first direction is the opposing movable electrode finger.

Accordingly, a configuration (shape) of the fixing portion becomes simple.

Application Example 6

In the physical quantity sensor according to the application example, it is preferable that the width of the fixed electrode finger is smaller than the width of the movable electrode finger.

Accordingly, it is possible to reduce the size of a detecting unit which is configured of the movable portion and the fixed electrode finger. As a result, it is possible to provide multiple detecting units, and to make a physical quantity sensor having high sensitivity.

Application Example 7

In the physical quantity sensor according to the application example, at least partially at a part which opposes the movable electrode finger in a longitudinal direction of the fixing portion, a decreasing portion in which a sectional area decreases toward the movable electrode finger is preferably provided.

Accordingly, it is possible to further improve mechanical strength.

Application Example 8

According to this application example, there is provided an electronic apparatus including the physical quantity sensor according to applications examples.

Accordingly, it is possible to realize an electronic apparatus having the above-described effects.

Application Example 9

According to this application example, there is provided an electronic apparatus including the physical quantity sensor according to application examples.

Accordingly, it is possible to realize a moving body having the above-described effects.

BRIEF DESCRIPTION OF THE DRAWINGS

The invention will be described with reference to the accompanying drawings, wherein like numbers reference like elements.

FIG. 3 is a sectional view cut along line III-III in FIG. 2.

DESCRIPTION OF EXEMPLARY EMBODIMENTS

Hereinafter, an appropriate embodiment of a physical quantity sensor, an electronic apparatus, and a moving body of the invention will be described with reference to the attached drawings.

First Embodiment

Figure 1:
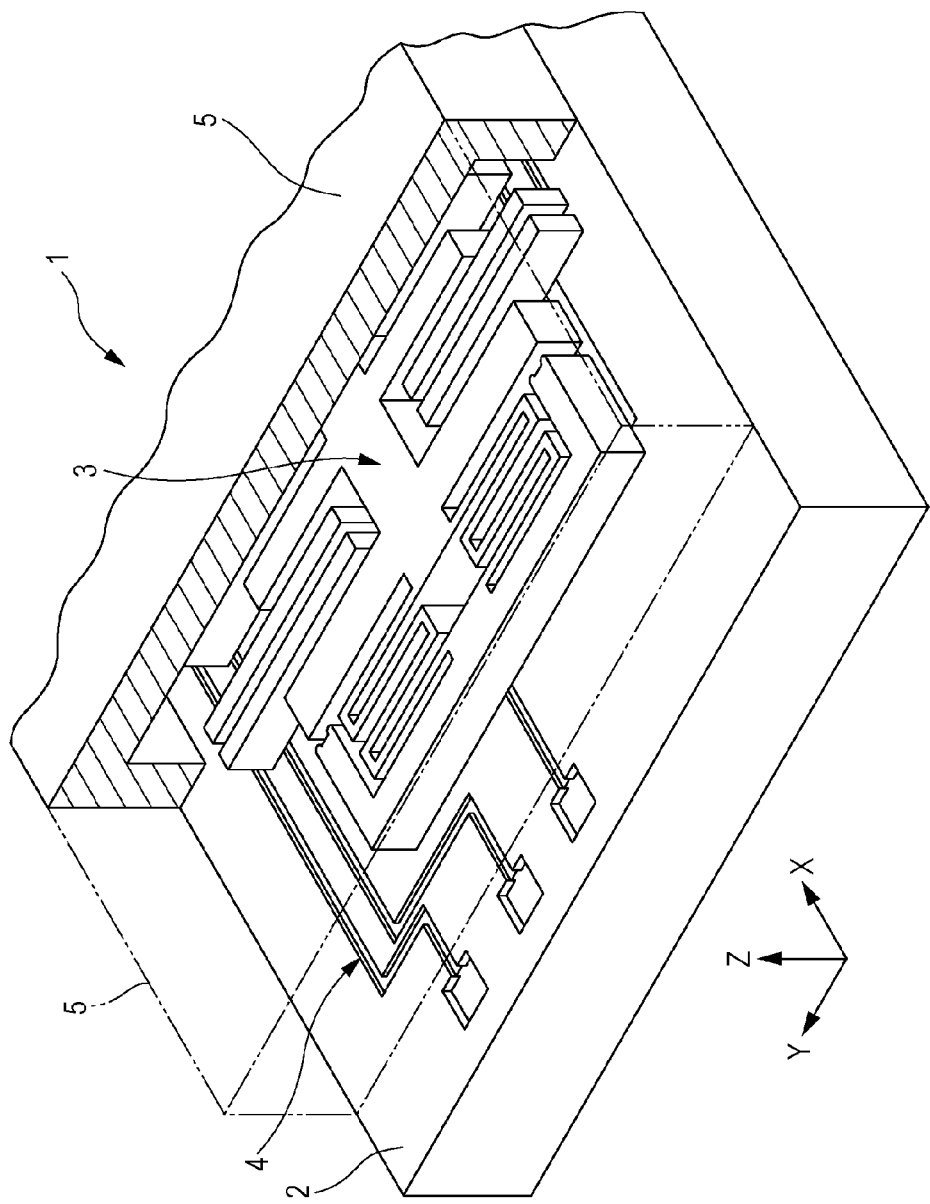
FIG. 1 is a perspective view illustrating a physical quantity sensor according to a first embodiment of the invention.
Figure 2:
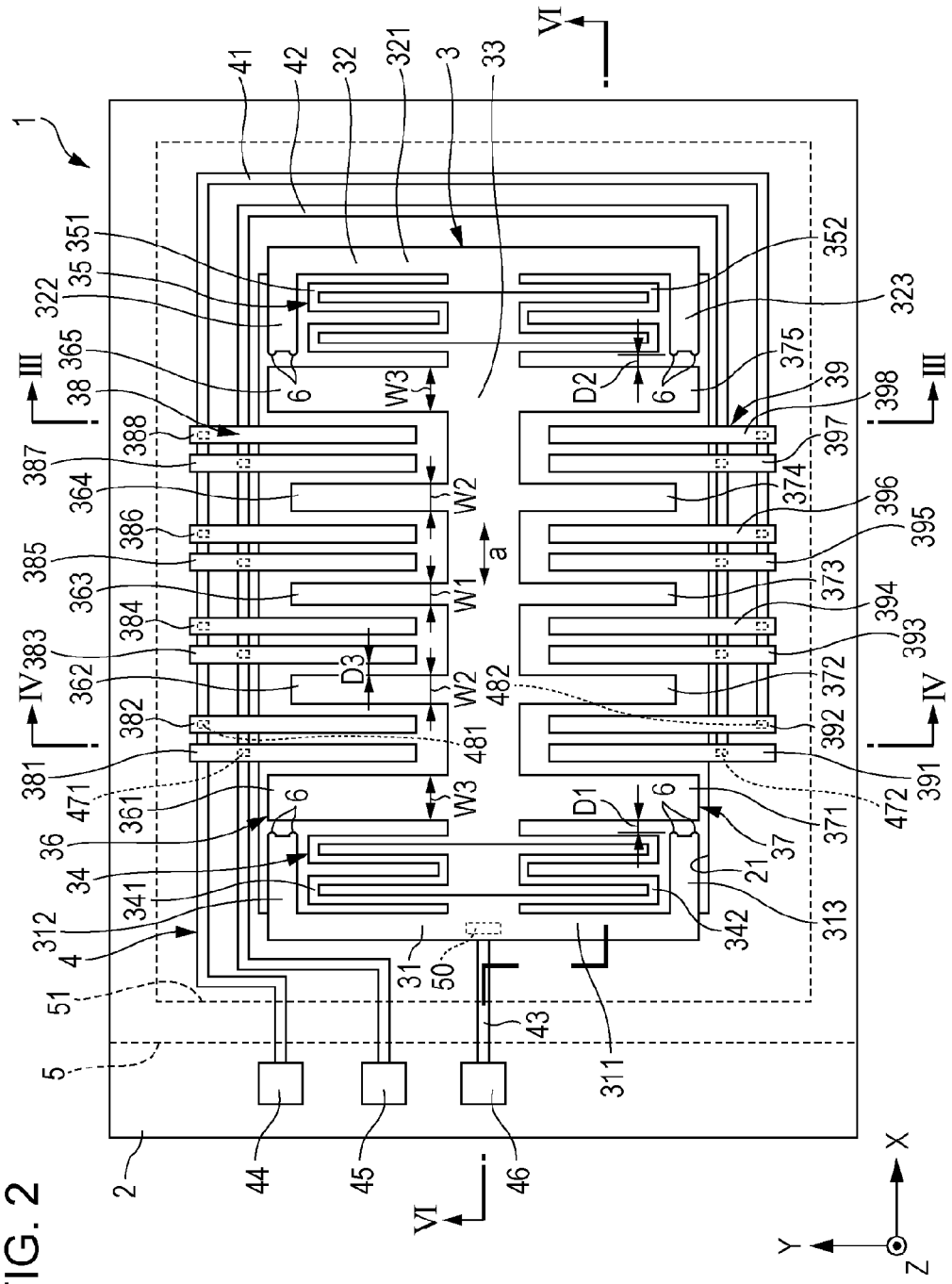
FIG. 2 is a plan view illustrating a physical quantity sensor illustrated in FIG. 1.
Figure 4:
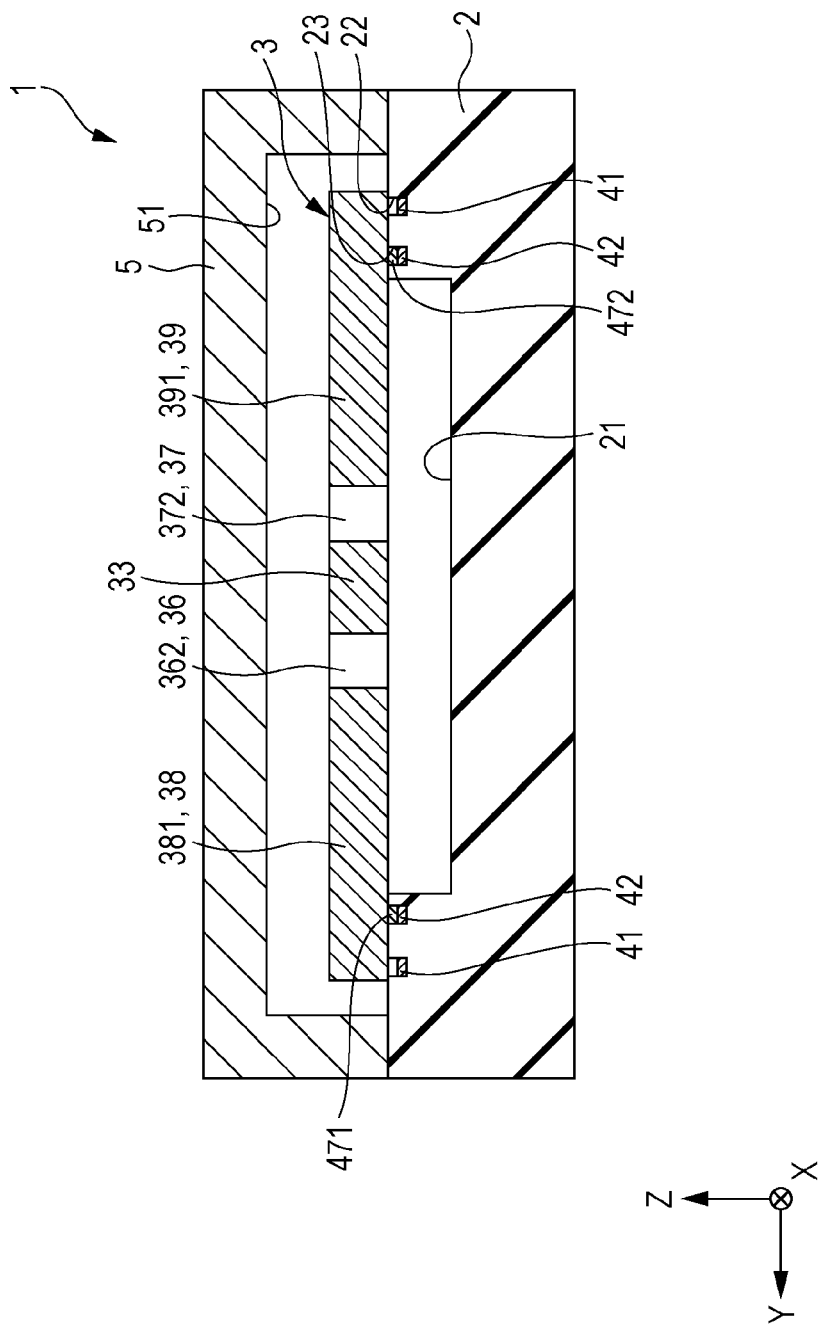
FIG. 4 is a sectional view cut along line IV-IV in FIG. 2.
Figure 5:
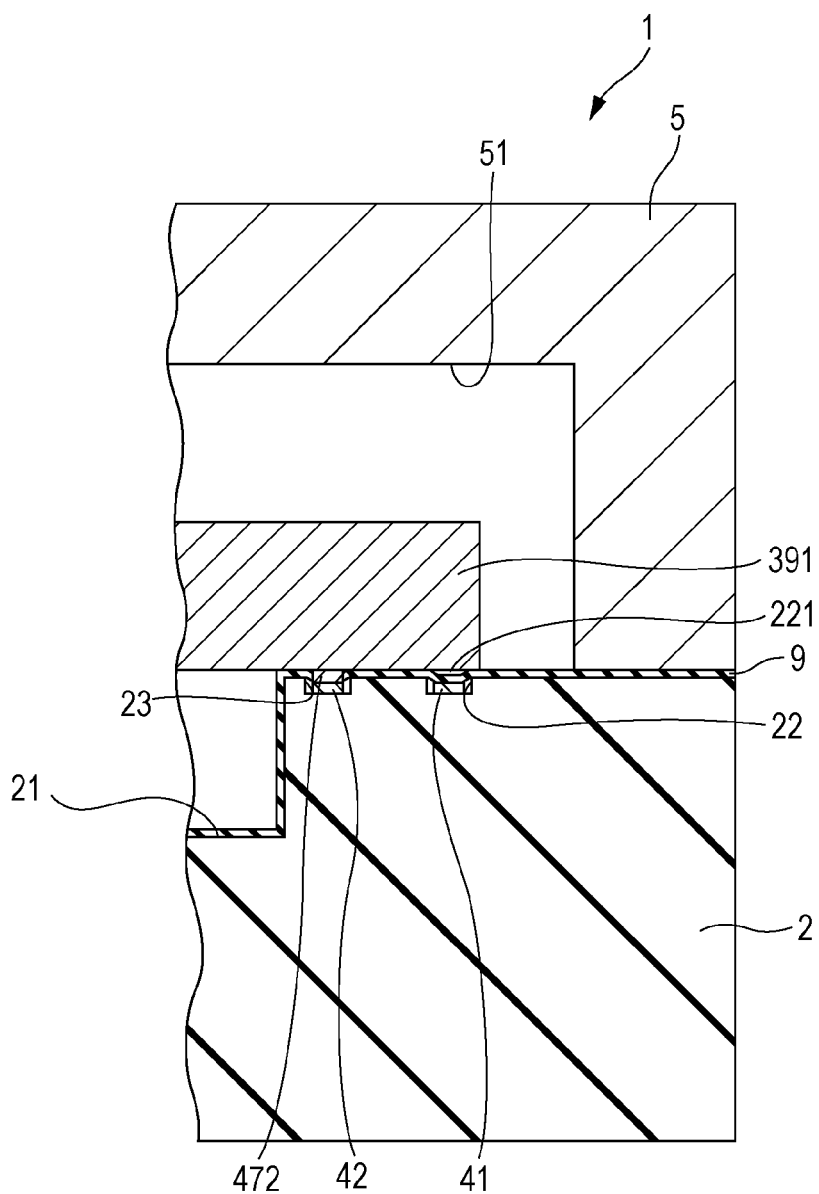
FIG. 5 is a partially enlarged view (partially enlarged sectional view) of FIG. 4.
Figure 6:
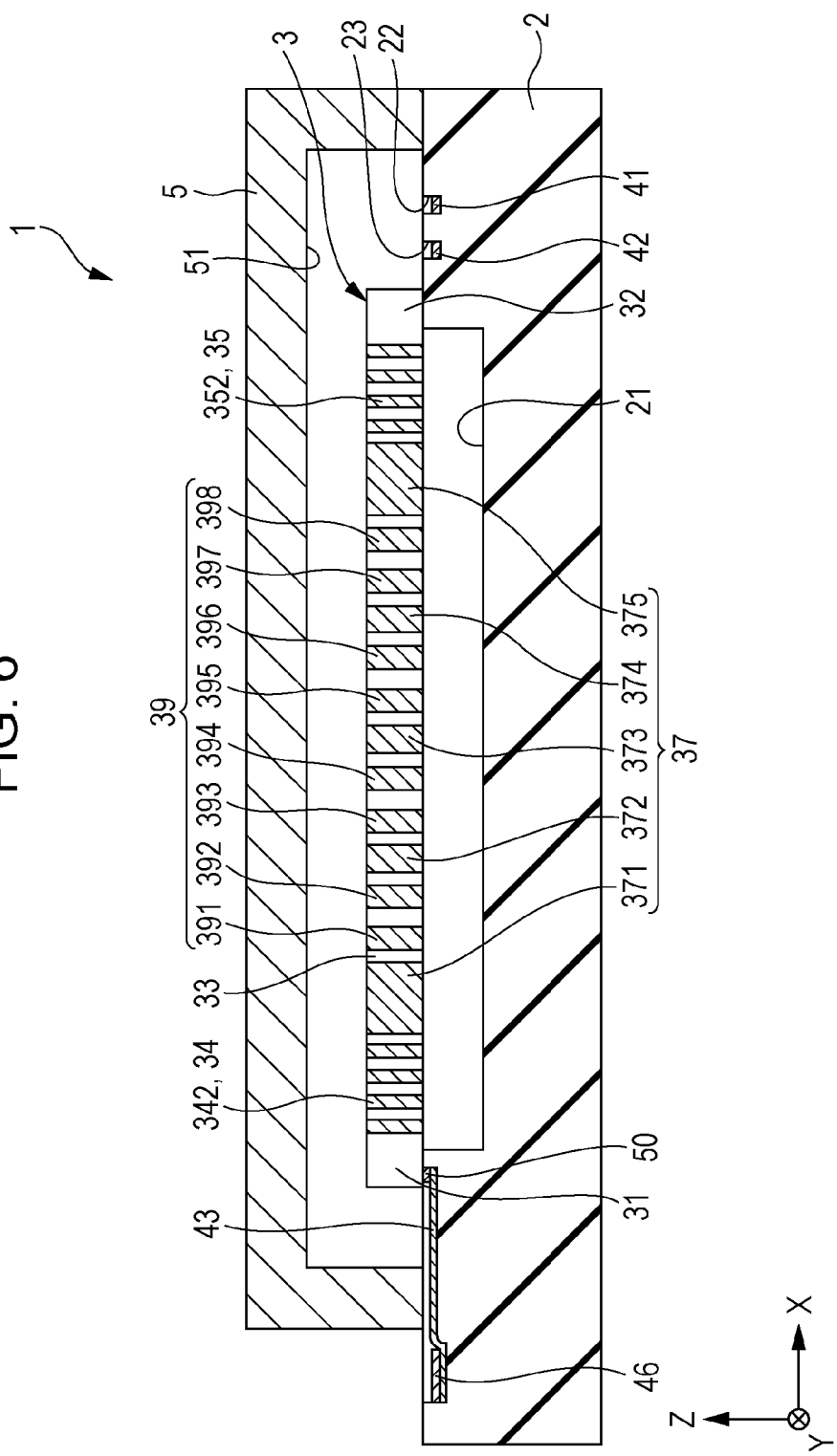
FIG. 6 is a sectional view cut along line VI-VI in FIG. 2.
Figure 7:
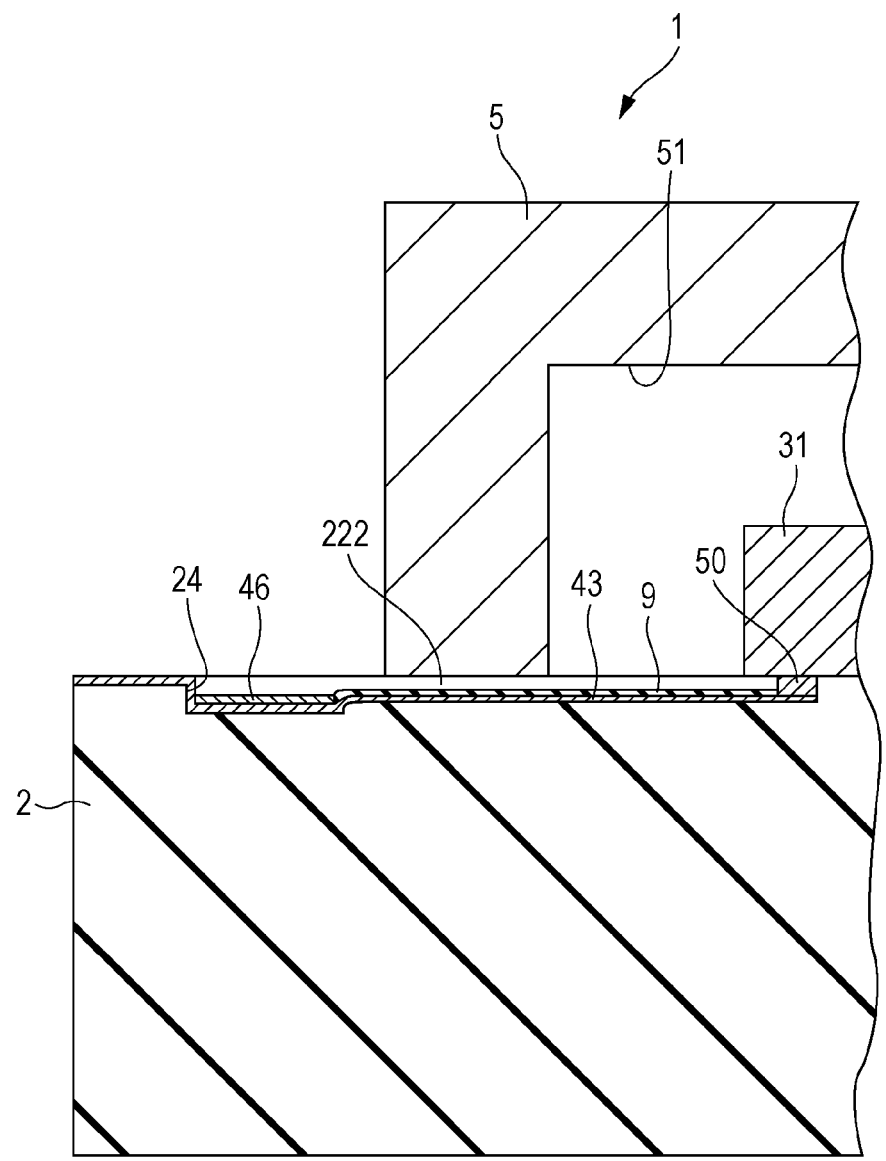
FIG. 7 is a partially enlarged view (partially enlarged sectional view) of FIG. 6.

FIG. 1 is a perspective view illustrating a physical quantity sensor according to a first embodiment of the invention. FIG. 2 is a plan view illustrating a physical quantity sensor illustrated in FIG. 1. FIG. 3 is a sectional view cut along line III-III in FIG. 2. FIG. 4 is a sectional view cut along line IV-IV in FIG. 2. FIG. 5 is a partially enlarged view (partially enlarged sectional view) of FIG. 4. FIG. 6 is a sectional view cut along line VI-VI in FIG. 2. FIG. 7 is a partially enlarged view (partially enlarged sectional view) of FIG. 6.

In addition, hereinafter, for convenience of description, a near side of a paper surface is called "upper", a far side of the paper surface is called "lower", a right side is called "right", and a left side is called "left" in FIG. 2. In addition, in FIGS. 1 to 4, and 6, as three axes which are orthogonal to each other, an X axis, a Y axis, and a Z axis are illustrated. In addition, hereinafter, a direction (horizontal direction) which is parallel to the X axis is called an "X-axis direction", a direction which is parallel to the Y axis is called a "Y-axis direction", and a direction (vertical direction) which is parallel to the Z axis is called a "Z-axis direction". In addition, in FIGS. 1 to 4, and 6, for convenience of description, an insulator film 9 which will be described later is omitted. In addition, in the embodiment, an example of a case where the physical quantity sensor is used as a physical quantity sensor element for measuring a physical quantity, such as an accelerating velocity or an angular velocity is described.

Physical Quantity Sensor

A physical quantity sensor 1 illustrated in FIGS. 1 and 2 includes a base substrate 2, an element piece (substrate) 3 which is bonded to and supported by the base substrate 2, a conductor pattern 4 which is electrically connected to the element piece 3, and a lid member 5 which is provided to cover the element piece 3, and a projected decreasing portion 6 which is formed in the element piece 3.

Hereinafter, each portion which constitutes the physical quantity sensor 1 will be described in detail in order.

Base Substrate

The base substrate 2 has a function of supporting the element piece 3. The base substrate 2 is a substrate (insulating substrate) which has insulation properties.

The base substrate 2 has a shape of a plate, and is provided with a cavity portion 21 on an upper surface (one surface) thereof. When the base substrate 2 is viewed from a plan view, the cavity portion 21 is formed to include a movable portion 33 of the element piece 3, movable electrode portions 36 and 37, and linking portions 34 and 35 which will be described later, and has an inner bottom. The cavity portion 21 constitutes a relief portion which prevents the movable portion 33 of the element piece 3, the movable electrode portions 36 and 37 and the linking portions 34 and 35 from coming into contact with the base substrate 2. Accordingly, it is possible to allow displacement of the movable portion 33 of the element piece 3.

In addition, instead of the cavity portion 21 (recessed portion), the relief portion may be an opening portion which passes through the base substrate 2 in a thickness direction thereof. In addition, in the embodiment, a shape when the cavity portion 21 is viewed in a plan view has a square shape (specifically, an oblong shape), but is not limited thereto.

In addition, on the upper surface of the base substrate 2, on an outer side of the above-described cavity portion 21, recessed portions 22, 23, and 24 are provided along an outer circumference thereof. The recessed portions 22, 23, and 24 each have a shape which corresponds to the conductor pattern 4 when viewed in a plan view. Specifically, the recessed portion 22 has a shape which corresponds to wiring 41 and an electrode 44 of the conductor pattern 4 which will be described later, the recessed portion 23 has a shape which corresponds to wiring 42 and an electrode 45 of the conductor pattern 4 which will be described later, and the recessed portion 24 has a shape which corresponds to wiring 43 and an electrode 46 of the conductor pattern 4 which will be described later.

In addition, the depth of a part at which the electrode 44 of the recessed portion 22 is provided is deeper than that of a part at which the wiring 41 of the recessed portion 22 is provided. Similarly, the depth of a part at which the electrode 45 of the recessed portion 23 is provided is deeper than that of a part at which the wiring 42 of the recessed portion 23 is provided. In addition, the depth of a part at which the electrode 46 of the recessed portion 24 is provided is deeper than that of a part at which the wiring 43 of the recessed portion 24 is provided.

As a configuration material of the base substrate 2, specifically, a silicon material and a glass material which have high resistance are preferable. In particular, when the element piece 3 is configured by using the silicon material as a main material, a glass material (for example, borosilicate glass, such as Pyrex glass (registered trademark)) containing alkali metal ion (movable ion) is preferably used. Accordingly, when the element piece 3 is configured by using silicon as a main material, anodic bonding between the base substrate 2 and the element piece 3 is possible.

In addition, as the configuration material of the base substrate 2, a material which has the smallest possible difference between the thermal expansion coefficient of the configuration material of the base substrate 2 and the thermal expansion coefficient of the configuration material of the element piece 3 is preferable. Specifically, it is preferable that the difference between the thermal expansion coefficient of the configuration material of the base substrate 2 and the thermal expansion coefficient of the configuration material of the element piece 3 is 3 ppm/° C. or less. Accordingly, even when exposed to a high temperature when bonding the base substrate 2 and the element piece 3 to each other, it is possible to reduce residual stress between the base substrate 2 and the element piece 3.

Element Piece

The element piece 3 is configured of fixing portions 31 and 32, the movable portion 33, the linking portions 34 and 35, the movable electrode portions 36 and 37, and fixed electrode portions 38 and 39. In addition, the linking portions 34 and 35, and the movable electrode portions 36 and 37 include the movable portion 33. In addition, among these, the fixing portions 31 and 32, the movable portion 33, the linking portions 34 and 35, and the movable electrode portions 36 and 37 are integrally formed.

The element piece 3 is, for example, displaced in the X-axis direction (+X direction or −X direction) while the movable portion 33 and the movable electrode portions 36 and 37 elastically deform the linking portions 34 and 35 in accordance with a change in a physical quantity, such as an accelerating velocity or an angular velocity. According to the displacement, the size of a void between the movable electrode portion 36 and the fixed electrode portion 38, and the size of a void between the movable electrode portion 37 and the fixed electrode portion 39, respectively change. In other words, according to the displacement, an electrostatic capacity between the movable electrode portion 36 and the fixed electrode portion 38, and an electrostatic capacity between the movable electrode portion 37 and the fixed electrode portion 39, respectively change. Therefore, based on these electrostatic capacities, it is possible to detect the physical quantity, such as an accelerating velocity or an angular velocity.

The fixing portions 31 and 32 are respectively bonded to the upper surface of the above-described base substrate 2. Specifically, at a part on the −X direction side (left side in the drawing) with respect to the cavity portion 21 on the upper surface of the base substrate 2, at least a part of the fixing portion 31 is bonded to the upper surface of the base substrate 2. In addition, at a part on the +X direction side (right side in the drawing) with respect to the cavity portion 21 on the upper surface of the base substrate 2, at least a part of the fixing portion 32 is bonded to the upper surface of the base substrate 2. In addition, when viewed from a plan view, the fixing portions 31 and 32 are respectively provided to straddle an outer circumferential edge of the cavity portion 21.

In addition, when viewed from a plan view, the fixing portions 31 and 32 respectively have a shape which wraps around the linking portions 34 and 35 which will be described later. In addition, at tip ends which wrap around the linking portions 34 and 35, the fixing portions 31 and 32 are configured to oppose movable electrode fingers 361, 365, 371, and 375 which will be described later in the X-axis direction (width direction of the movable electrode).

In addition, at the above-described tip ends which wrap around the linking portions 34 and 35 in the fixing portions 31 and 32, the decreasing portion (projection) 6 in which a sectional area decrease toward each movable electrode finger is provided. In addition, a shape of the decreasing portion 6 is not limited to a shape of a projection.

When describing more specifically, the fixing portion 31 includes a base portion 311 which extends in the Y-axis direction, and is bonded to the base substrate 2; a protruded portion 312 which is positioned on a +Y-axis side of the linking portion 34, and protrudes to the movable portion 33 side (+X-axis side) from an end portion on the +Y-axis side of the base portion 311; and a protruded portion 313 which is positioned on a −Y-axis side of the linking portion 34, and protrudes to the movable portion 33 side (+X-axis side) from an end portion on the −Y-axis side of the base portion 311. In addition, the tip end portions of the protruded portions 312 and 313 oppose the movable electrode fingers 361 and 371, and the decreasing portion 6 is provided at these tip end portions to protrude toward the movable electrode fingers 361 and 371. In addition, the decreasing portion 6 is separated from the base substrate 2, but is not particularity limited.

Similarly, the fixing portion 32 includes a base portion 321 which extends in the Y-axis direction, and is bonded to the upper surface of the base substrate 2; a protruded portion 322 which is positioned on the +Y-axis side of the linking portion 35, and protrudes to the movable portion 33 side (−X-axis side) from the end portion of the +Y-axis side of the base portion 321; and a protruded portion 323 which is positioned on the −Y-axis side of the linking portion 35, and protrudes to the movable portion 33 side (−X-axis side) from the end portion of the −Y-axis side of the base portion 321.

In addition, the tip end portions of the protruded portions 322 and 323 oppose the movable electrode fingers 365 and 375, and the decreasing portion 6 is provided in these tip end portions to protrude toward the movable electrode fingers 365 and 375. In addition, the decreasing portion 6 is separated from the base substrate 2, but is not particularity limited.

In addition, the positions and the shapes of the fixing portions 31 and 32 are determined in accordance with the positions and the shapes of the linking portions 34 and 35, or the conductor pattern 4, and are not limited to the description above.

Between the two fixing portions 31 and 32, the movable portion 33 is provided. In the embodiment, the movable portion 33 has a longitudinal shape which extends in the X-axis direction. In addition, the shape of the movable portion 33 is determined in accordance with the shapes or the sizes of each portion that constitutes the element piece 3, and is not particularly limited to the description above.

The movable portion 33 is linked to the fixing portion 31 via the linking portion 34 at the end portion on the fixing portion 31 side (−X-axis side), and is linked to the fixing portion 32 via the linking portion 35 at the end portion on the fixing portion 32 side (+x-axis side). In this manner, by linking both end portions of the movable portion 33 to the fixing portions 31 and 32, the movable portion 33 is stably displaced in the X-axis direction.

The linking portions 34 and 35 link the movable portion 33 to the fixing portions 31 and 32 to be displaceable. In the embodiment, as illustrated by an arrow a in FIG. 2, the linking portions 34 and 35 are configured to be able to displace the movable portion 33 in the X-axis direction (first direction).

When describing specifically, the linking portion 34 is configured of two beams 341 and 342 which are disposed parallel to each other in the Y-axis direction. In addition, the beams 341 and 342 respectively have shapes which extend in the X-axis direction while meandering in the Y-axis direction. In other words, the beams 341 and 342 respectively have a shape of being folded plural times (3 times in the embodiment) in the Y-axis direction. In addition, the number of times of folding of each of the beams 341 and 342 may be 1 or 2, and may be 4 or more.

Similarly, the linking portion 35 is configured of two beams 351 and 352 which are disposed parallel to each other in the Y-axis direction, and have shapes which extend in the X-axis direction while meandering in the Y-axis direction.

In addition, if the linking portions 34 and 35 support the movable portion 33 to be displaceable with respect to the base substrate 2, the linking portions 34 and 35 are not limited to the description above, and for example, may be configured of one pair of beams which respectively extend in the +Y direction and the −Y direction from both end portions of the movable portion 33.

In this manner, the movable electrode portion 36 is provided on one side (+Y direction side) in the width direction of the movable portion 33 which is supported to be displaceable with respect to the base substrate 2 in the X-axis direction, and the movable electrode portion 37 is provided on the other side (−Y direction side).

The movable electrode portion 36 is provided with the plurality of movable electrode fingers 361, 362, 363, 364, and 365 which protrude in the +Y direction from the movable portion 33, and are aligned in a shape of comb teeth. These movable electrode fingers 361, 362, 363, 364, and 365 are aligned in this order from the −X direction side to the +X direction side. Similarly, the movable electrode portion is provided with the plurality of movable electrode fingers 371, 372, 373, 374, and 375 which protrude in the −Y direction from the movable portion 33, and are aligned in a shape of comb teeth. The movable electrode fingers 371, 372, 373, 374, and 375 are aligned in this order from the −X direction side to the +X direction side.

In this manner, the plurality of movable electrode fingers 361 to 365 and the plurality of movable electrode fingers 371 to 375 are respectively provided to be aligned in a direction (that is, the X-axis direction) in which the movable portion 33 is displaced. Accordingly, the electrostatic capacity between fixed electrode fingers 382, 384, 386, and 388 which will be described later and the movable electrode portion 36, and the electrostatic capacity between fixed electrode fingers 381, 383, 385, and 387 and the movable electrode portion 36, can be efficiently changed in accordance with the displacement of the movable portion 33. Similarly, the electrostatic capacity between fixed electrode fingers 392, 394, 396, and 398 which will be described later and the movable electrode portion 37, and the electrostatic capacity between fixed electrode fingers 391, 393, 395, and 397 and the movable electrode portion 37 can be efficiently changed in accordance with the displacement of the movable portion 33. For this reason, when the physical quantity sensor 1 is used as the physical quantity sensor element, detection accuracy can be excellent.

In addition, among the movable electrode fingers 361 to 365, and 371 to 375, the movable electrode fingers 361 and 371 which are positioned on the most −X-axis side, and oppose the fixing portion 31 in the X-axis direction, and the movable electrode fingers 365 and 375 which are positioned on the most +X-axis side, and oppose the fixing portion 32 in the X-axis direction, are respectively configured to have larger width (length in the X-axis direction) than that of other movable electrode fingers (that is, the movable electrode fingers 362, 363, and 364 which are positioned between the movable electrode fingers 361 and 365, and the movable electrode fingers 372, 373, and 374 which are positioned between the movable electrode fingers 371 and 375).

In addition, a clearance D1 between the fixing portion 31 and the movable electrode fingers 361 and 371, and a clearance D2 between the fixing portion 32 and the movable electrode fingers 365 and 375, are respectively smaller than a clearance (for example, a clearance between the movable electrode finger 362 and the fixed electrode finger 383) D3 between the adjacent movable electrode finger and the fixed electrode finger. In other words, a relationship of D1, D2<D3 is satisfied. In addition, the clearance D1 indicates a distance from the tip end of the decreasing portion 6 to the movable electrode fingers 361 and 371, and the clearance D2 indicates a distance from the tip end of the decreasing portion 6 to the movable electrode fingers 365 and 375.

In this manner, by satisfying D1, D2<D3, the following effects can be achieved. For example, when an accelerating velocity (impact) in the X-axis direction is applied to the physical quantity sensor 1, and the movable portion 33 is displaced excessively in the X-axis direction, before each of the movable electrode fingers 361 to 365, and 371 to 375 strikes the adjacent fixed electrode finger, the movable electrode fingers 361 and 371 strike the fixing portion 31 (decreasing portion 6), or the movable electrode fingers 365 and 375 strike the fixing portion 32 (decreasing portion 6). In other words, as the movable electrode fingers 361, 365, 371, and 375 become a stopper, and the further displacement of the movable portion 33 in the X-axis direction is restricted, the movable electrode fingers 361 to 365, and 371 to 375, are prevented from striking the adjacent fixed electrode fingers. Accordingly, it is possible to prevent damage to the movable electrode finger or the fixed electrode finger. In addition, as described above, since the thickness and rigidity (mechanical strength) of the movable electrode fingers 361, 365, 371, and 375 are greater than those of the other movable electrode fingers 362, 363, 364, 372, 373, and 374, damage or the like caused by striking the fixing portions 31 and 32 (decreasing portion 6) is sufficiently prevented. In addition, it is preferable that the decreasing portion 6 is provided at a part which is separated from the movable portion 33 of the movable electrode fingers 361, 365, 371, and 375. In other words, it is preferable that the decreasing portion 6 is disposed to be able to come into contact with the tip end side of the movable electrode fingers 361, 365, 371, and 375. By doing so, it is possible to effectively suppress excessive displacement due to rotation of the movable portion 33 around the Z axis.

In this manner, according to the embodiment, the physical quantity sensor 1 becomes impact resistant, and has excellent mechanical strength.

In particular, in the embodiment, the width of 5 movable electrode fingers 361 to 365 which are aligned in the X-axis direction becomes greater as the movable electrode fingers are positioned to be closer to both end portions in an extending direction of the movable portion 33, and smaller as the movable electrode fingers are positioned to be closer to the central portion (center portion). In other words, as 5 movable electrode fingers 361 to 365 which are aligned in the X-axis direction becomes farther from a portion connected with the linking portions 34 and 35 (fixing portions 31 and 32) of the movable portion 33, the width thereof becomes smaller. Specifically, a width W1 of the movable electrode finger 363 which is positioned in the central portion (central portion in the X-axis direction) of the movable portion 33 becomes the smallest, a width W2 of the movable electrode fingers 362 and 364 which are positioned to be closer to the end portion side of the movable portion 33 than the movable electrode finger 363 becomes greater than the width W1, and a width W3 of the movable electrode fingers 361 and 365 which are positioned to be closer to the end portion of the movable portion 33 than the movable electrode fingers 362 and 364 becomes greater than the width W2. In other words, a relationship of W1<W2<W3 is satisfied. In addition, the width of 5 movable electrode fingers 371 to 375 which are aligned in the X-axis direction is also similar.

According to this configuration, it is possible to effectively suppress the movable portion 33 being stuck to the base substrate 2 during the manufacturing (during the anodic bonding between the base substrate 2 and the element piece 3). Specifically, since both end portions of the movable portion 33 are linked to the fixing portions 31 and 32 via the linking portions 34 and 35, by reducing the weight of the central portion of the movable portion 33, it is possible to reduce generation of deflection of the movable portion 33 due to its own weight. In addition, since an electrostatic force between the movable electrode finger and the base substrate 2 which is generated during the anodic bonding becomes smaller as the width of the movable electrode finger becomes smaller, by reducing the width of the movable electrode finger which is positioned at the central portion of the movable portion 33, it is possible to reduce generation of deflection of the movable portion 33 due to the electrostatic force. Accordingly, according to the embodiment, it is possible to effectively reduce generation of deflection due to the weight of the movable portion 33 and due to the electrostatic force, and as described above, it is possible to effectively suppress the movable portion 33 being stuck to the base substrate 2.

The movable electrode portion 36 opposes the fixed electrode portion 38 while being separated at a certain interval. In addition, the movable electrode portion 37 opposes the fixed electrode portion 39 while being separated at a certain interval.

The fixed electrode portion 38 is provided with the plurality of fixed electrode fingers 381 to 388 which are aligned in a shape of comb teeth that mesh with the plurality of movable electrode fingers 361 to 365 of the above-described movable electrode portion 36 while being separated at a certain interval. In the plurality of fixed electrode fingers 381 to 388, the end portions on a side opposite to the movable portion 33 are respectively bonded to a part on the +Y direction side with respect to the cavity portion 21 on the upper surface of the base substrate 2. In addition, in each of the fixed electrode fingers 381 and 388, ends on fixed sides are fixed ends, and free ends extend in the -Y direction.

The fixed electrode fingers 381 to 388 are aligned in this order from the -X direction side to the +X direction side. In addition, the fixed electrode fingers 381 and 382 are in a pair and face each other between the above-described movable electrode fingers 361 and 362, the fixed electrode fingers 383 and 384 are in a pair and face each other between the movable electrode fingers 362 and 363, the fixed electrode fingers 385 and 386 are in a pair and face each other between the movable electrode fingers 363 and 364, and the fixed electrode fingers 387 and 388 are in a pair and face each other between the movable electrode fingers 364 and 365.

In addition, the widths of the fixed electrode fingers 381 to 388 are configured to be smaller than the widths of each movable electrode finger. According to this configuration, it is possible to reduce the size of a detecting unit which is configured of the movable portion 33 and the fixed electrode fingers 381 to 388. As a result, it is possible to provide multiple detecting units, and to achieve high sensitivity of the physical quantity sensor.

Here, each of the fixed electrode fingers 382, 384, 386, and 388 is a first fixed electrode finger, and each of the fixed electrode fingers 381, 383, 385, and 387 is a second fixed electrode finger which is separated from the first fixed electrode finger on the base substrate 2 via an aperture (void). In this manner, the plurality of fixed electrode fingers 381 to 388 are configured of the plurality of first fixed electrode fingers and the plurality of second fixed electrode fingers which are alternately aligned. In other words, the first fixed electrode finger is disposed on one side of the movable electrode finger, and the second fixed electrode finger is disposed on the other side.

The first fixed electrode fingers 382, 384, 386, and 388, and the second fixed electrode fingers 381, 383, 385, and 387 are separated from each other on the base substrate 2. In other words, the first fixed electrode fingers 382, 384, 386, and 388, and the second fixed electrode fingers 381, 383, 385, and 387, are not linked to each other and are independent in a shape of islands, on the base substrate 2. Accordingly, it is possible to electrically insulate the first fixed electrode fingers 382, 384, 386, and 388, and the second fixed electrode fingers 381, 383, 385, and 387 from each other. For this reason, the electrostatic capacity between the first fixed electrode fingers 382, 384, 386, and 388 and the movable electrode portion 36, and the electrostatic capacity between the second fixed electrode fingers 381, 383, 385, and 387 and the movable electrode portion 36, are separately measured, and based on the measurement result, it is possible to detect the physical quantity with high accuracy.

In the embodiment, the fixed electrode fingers 381 to 388 are separated from each other on the base substrate 2. In other words, each of the fixed electrode fingers 381 to 388 are not linked to each other and are independent in a shape of islands, on the base substrate 2. Accordingly, it is possible to make the lengths of the fixed electrode fingers 381 to 388 uniform in the Y-axis direction. For this reason, while ensuring an area which is necessary for obtaining sufficient bonding strength of each bonding portion between each of the fixed electrode fingers 381 to 388 and the base substrate 2, it is possible to reduce the size of the fixed electrode fingers 381 to 388. For this reason, while making impact resistance of the physical quantity sensor 1 excellent, it is possible to reduce the size of the physical quantity sensor 1.

Similarly, the fixed electrode portion 39 is provided with the plurality of fixed electrode fingers 391 to 398 which are aligned in a shape of comb teeth that mesh with the plurality of movable electrode fingers 371 to 375 of the above-described movable electrode portion 37 while being separated at a certain interval. In the plurality of fixed electrode fingers 391 to 398, the end portions on a side opposite to the movable portion 33 are respectively bonded to a part on the −Y direction side with respect to the cavity portion 21 on the upper surface of the base substrate 2. In addition, in each of the fixed electrode fingers 391 to 398, ends on fixed sides are fixed ends, and free ends extend in the +Y direction.

The fixed electrode fingers 391 to 398 are aligned in this order from the −X direction side to the +X direction side. In addition, the fixed electrode fingers 391 and 392 are in a pair and face each other between the above-described movable electrode fingers 371 and 372, the fixed electrode fingers 393 and 394 are in a pair and face each other between the movable electrode fingers 372 and 373, the fixed electrode fingers 395 and 396 are in a pair and face each other between the movable electrode fingers 373 and 374, and the fixed electrode fingers 397 and 398 are in a pair and face each other between the movable electrode fingers 374 and 375.

Here, each of the fixed electrode fingers 392, 394, 396, and 398 is a first fixed electrode finger, and each of the fixed electrode fingers 391, 393, 395, and 397 is a second fixed electrode finger which is separated from the first fixed electrode finger on the base substrate 2 via an aperture (void). In this manner, the plurality of fixed electrode fingers 391 to 398 are configured of the plurality of first fixed electrode fingers and the plurality of second fixed electrode fingers which are alternately aligned. In other words, the first fixed electrode finger is disposed on one side of the movable electrode finger, and the second fixed electrode finger is disposed on the other side.

Similar to the above-described fixed electrode portion 38, the first fixed electrode fingers 392, 394, 396, and 398, and the second fixed electrode fingers 391, 393, 395, and 397, are separated from each other on the base substrate 2. Accordingly, the electrostatic capacity between the first fixed electrode fingers 392, 394, 396, and 398 and the movable electrode portion 37, and the electrostatic capacity between the second fixed electrode fingers 391, 393, 395, and 397 and the movable electrode portion 37, are separately measured, and based on the measurement result, it is possible to detect the physical quantity with high accuracy.

In the embodiment, similar to the above-described fixed electrode portion 38, the plurality of fixed electrode fingers 391 to 398 are separated from each other on the base substrate 2. Accordingly, while ensuring a sufficient area of each bonding portion between each of the fixed electrode fingers 391 to 398 and the base substrate 2, it is possible to reduce the size of the fixed electrode fingers 391 to 398. For this reason, while making impact resistance of the physical quantity sensor 1 excellent, it is possible to reduce the size of the physical quantity sensor 1.

The element piece 3 (that is, the fixing portions 31 and 32, the movable portion 33, the linking portions 34 and 35, the plurality of fixed electrode fingers 381 to 388, and 391 to 398, and the plurality of movable electrode fingers 361 to 365, and 371 to 375) is formed by etching one substrate.

Accordingly, it is possible to increase the thicknesses of the fixing portions 31 and 32, the movable portion 33, the linking portions 34 and 35, the plurality of fixed electrode fingers 381 to 388, and 391 to 398, and the plurality of movable electrode fingers 361 to 365, and 371 to 375. In addition, it is possible to make the thicknesses uniform simply and with high accuracy. According to this, it is possible to achieve high sensitivity of the physical quantity sensor 1, and to improve impact properties of the physical quantity sensor 1.

In addition, if it is possible to detect the physical quantity based on a change in the above-described electrostatic capacity, the configuration material of the element piece 3 is not particularly limited, but semiconductor is preferable. Specifically, for example, a silicon material, such as single crystal silicon or polysilicon, is preferably used.

In other words, it is preferable that each of the fixing portions 31 and 32, the movable portion 33, the linking portions 34 and 35, the plurality of fixed electrode fingers 381 to 388, and 391 to 398, and the plurality of movable electrode fingers 361 to 365, and 371 to 375, is configured by using silicon as a main material.

Silicon can be processed by etching with high accuracy. For this reason, as the element piece 3 is configured by using silicon as a main material, it is possible to make the element piece 3 having excellent dimension accuracy, and as a result, to achieve high sensitivity of the physical quantity sensor 1 which is a physical quantity sensor element. In addition, since a level of fatigue of silicon is low, it is possible to improve durability of the physical quantity sensor 1.

In addition, as a silicon material which constitutes the element piece 3, a material which is doped with impurities, such as phosphorus or boron, is preferable. Accordingly, it is possible to achieve excellent conductivity of the element piece 3.

In addition, as described above, as the fixing portions 31 and 32, and the fixed electrode portions 38 and 39 are bonded to the upper surface of the base substrate 2, the element piece 3 is supported by the base substrate 2. In the embodiment, the base substrate 2 and the element piece 3 are bonded to each other via the insulator film 9 which will be described later.

A bonding method between the element piece 3 (specifically, the above-described fixing portions 31 and 32, and each of the fixed electrode fingers 381 to 388, and 391 to 398) and the base substrate 2 is not particularly limited, but an anodic bonding method is preferably used. Accordingly, it is possible to solidly bond the fixing portions 31 and 32, and the fixed electrode portions 38 and 39 (each of the fixed electrode fingers 381 to 388, and 391 to 398) to the base substrate 2. For this reason, it is possible to improve the impact resistance of the physical quantity sensor 1. In addition, it is possible to bond the fixing portions 31 and 32 and the fixed electrode portions 38 and 39 (each of the fixed electrode fingers 381 to 388, and 391 to 398) to a desired position of the base substrate 2 with high accuracy. For this reason, it is possible to achieve high sensitivity of the physical quantity sensor 1 which is a physical sensor element. In this case, the element piece 3 is configured by using the above-described silicon as a main material, and the base substrate 2 is configured of a glass material which contains alkali metal ion.

Conductor Pattern

The conductor pattern 4 is provided on the upper surface (surface on the fixed electrode portions 38 and 39 sides) of the above-described base substrate 2.

As illustrated in FIGS. 4 to 6, the conductor pattern 4 is configured of the wirings 41, 42, and 43, and the electrodes 44, 45, and 46.

The wiring 41 is provided on an outer side of the cavity portion 21 of the above-described base substrate 2, and formed along an outer circumference of the cavity portion 21. In addition, one end portion of the wiring 41 is connected to the electrode 44 on the outer circumferential portion (a part on the outer side of the lid member 5 on the base substrate 2) on the upper surface of the base substrate 2.

The wiring 41 is electrically connected to each of the fixed electrode fingers 382, 384, 386, and 388, and each of the fixed electrode fingers 392, 394, 396, and 398, which are first fixed electrode fingers of the above-described element piece 3. Here, the wiring 41 is first wiring which is electrically connected to each of the first fixed electrode fingers.

In addition, the wiring 42 is provided along the outer circumferential edge on an inner side of the above-described wiring 41, and on an outer side of the cavity portion 21 of the above-described base substrate 2. In addition, one end portion of the wiring 42 is connected to the electrode 45 on the outer circumferential portion (a part on the outer side of the lid member 5 on the base substrate 2) on the upper surface of the base substrate 2 to be aligned with respect to the above-described electrode 44 while being separated at a certain interval.

The wiring 43 is provided to extend on the outer circumferential portion (a part on the outer side of the lid member 5 on the base substrate 2) on the upper surface of the base substrate 2 from the bonding portion between the wiring 43 and the fixing portion 31 on the base substrate 2. In addition, the end portion on a side opposite to the fixing portion 31 of the wiring 43 is connected to the electrode 46 on the outer circumferential portion (a part on the outer side of the lid member 5 on the base substrate 2) on the upper surface of the base substrate 2 to be aligned with respect to the above-described electrodes 44 and 45 while being separated at a certain interval.

Configuration materials of the wirings 41 to 43, are not particularly limited if materials respectively have conductivity, and various types of electrode materials may be used. For example, examples thereof include an oxide (transparent electrode material) (e.g., indium tin oxide (ITO), indium zinc oxide (IZO), $In_2O_3$, $SnO_2$, $SnO_2$ containing Sb, and ZnO containing Al), Au, Pt, Ag, Cu, Al, or an alloy containing these. Among these materials, one material may be used alone, or two or more materials may be used together.

Among these materials, as the configuration materials of the wirings 41 to 43, a material which uses a transparent electrode material (in particular, ITO) is preferable. When the wirings 41 and 42 are respectively configured of transparent electrode materials, in a case where the base substrate 2 is a transparent substrate, it is possible to easily visually confirm foreign substances or the like which are present on the surface on the fixed electrode portions 38 and 39 sides of the base substrate 2 from a surface side opposite to the fixed electrode portions 38 and 39 of the base substrate 2. For this reason, it is possible to more reliably provide the physical quantity sensor 1 as a physical quantity sensor element having high sensitivity.

In addition, similar to the above-described wirings 41 to 43, configuration materials of the electrodes 44 to 46 are not particularly limited if materials respectively have conductivity, and various types of electrode materials can be used. In the embodiment, as the configuration materials of the electrodes 44 to 46, the same materials as configuration materials of projections 471, 472, 481, and 482 which will be described later are used.

As the wirings 41 and 42 (first wiring and second wiring) are provided on the upper surface of the base substrate 2, the electrostatic capacity between the first fixed electrode fingers 382, 384, 386, and 388 and the movable electrode portion 36, and the electrostatic capacity between the first fixed electrode fingers 392, 394, 396, and 398 and the movable electrode portion 37 are measured via the wiring 41, and the electrostatic capacity between the second fixed electrode fingers 381, 383, 385, and 387 and the movable electrode portion 36, and the electrostatic capacity between the second fixed electrode fingers 391, 393, 395, and 397 and the movable electrode portion 37 can be measured via the wiring 42.

In the embodiment, by using the electrode 44 and the electrode 46, it is possible to measure the electrostatic capacity between the first fixed electrode fingers 382, 384, 386, and 388 and the movable electrode portion 36, and the electrostatic capacity between the first fixed electrode fingers 392, 394, 396, and 398 and the movable electrode portion 37. In addition, by using the electrode 45 and the electrode 46, it is possible to measure the electrostatic capacity between the second fixed electrode fingers 381, 383, 385, and 387 and the movable electrode portion 36, and the electrostatic capacity between the second fixed electrode fingers 391, 393, 395, and 397 and the movable electrode portion 37.

In addition, since the wirings 41 and 42 are provided on the upper surface (that is, on the surface on the fixed electrode portions 38 and 39) of the base substrate 2, it is easy to electrically connect and position the fixed electrode portions 38 and 39. For this reason, it is possible to improve reliability (in particular, impact resistance and detection accuracy) of the physical quantity sensor 1.

In addition, the wiring 41 and the electrode 44 are provided in the recessed portion (first recessed portion) 22 of the above-described base substrate 2, the wiring 42 and the electrode 45 are provided in the recessed portion (second recessed portion) 23 of the above-described base substrate 2, and the wiring 43 and the electrode 46 are provided in the recessed portion (third recessed portion) 24 of the above-described base substrate 2. Accordingly, the wirings 41 to 43 can be prevented from protruding from a plate surface of the base substrate 2. For this reason, while ensuring bonding (fixing) between each of the fixed electrode fingers 381 to 388, and 391 to 398, and the base substrate 2, it is possible to electrically connect the fixed electrode fingers 382, 384, 386, 388, 392, 394, 396, and 398 and the wiring 41 to each other, and to electrically connect the fixed electrode fingers 381, 383, 385, 387, 391, 393, 395, and 397 and the wiring 42 to each other. Similarly, while ensuring bonding (fixing) between the fixing portion 31 and the base substrate 2, it is possible to electrically connect the fixing portion 31 and the wiring 43 to each other. Here, when the thickness of the wirings 41 to 43 is respectively t, and the depth of a part where the wiring 41 of the above-described recessed portions 22 to 24 is provided is respectively d, a relationship of $t < d$ is satisfied.

In particular, on the wiring 41 which is the first wiring, a plurality of projections 481 and a plurality of projections 482 which are first projections having conductivity are provided. The plurality of projections 481 are provided corresponding to the fixed electrode fingers 382, 384, 386, and 388 which are the plurality of first fixed electrode fingers, and the plurality of projections 482 are provided corresponding to the fixed electrode fingers 392, 394, 396, and 398 which are the plurality of first fixed electrode fingers.

In addition, the fixed electrode fingers 382, 384, 386, and 388 and the wiring 41 are electrically connected to each other via the plurality of projections 481, the fixed electrode fingers 392, 394, 396, and 398 and the wiring 41 are electrically connected to each other via the plurality of projections 482.

Accordingly, while preventing unintentional electrical connection (short circuit) between the wiring 41 and other parts, it is possible to electrically connect each of the fixed electrode fingers 382, 384, 386, 388, 392, 394, 396, and 398 and the wiring 41 to each other.

Similarly, on the wiring 42 which is the second wiring, a plurality of projections 471 and a plurality of projections 472 which are second projections having conductivity are provided (refer to FIGS. 2 and 4). The plurality of projections 471 are provided corresponding to the fixed electrode fingers 381, 383, 385, and 387 which are the plurality of second fixed electrode fingers, and the plurality of projections 472 are provided corresponding to the fixed electrode fingers 391, 393, 395, and 397 which are the plurality of second fixed electrode fingers.

In addition, the fixed electrode fingers 381, 383, 385, and 387 and the wiring 42 are electrically connected to each other via the plurality of projections 471, and the fixed electrode fingers 391, 393, 395, and 397 and the wiring 42 are electrically connected to each other via the plurality of projections 472.

Accordingly, while preventing unintentional electric connection (short circuit) between the wiring 42 and other parts, it is possible to electrically connect each of the fixed electrode fingers 381, 383, 385, 387, 391, 393, 395, and 397 and the wiring 42 to each other.

Configuration materials of the projections 471, 472, 481, and 482 are not particularly limited if materials respectively have conductivity, and various types of electrode materials may be used. For example, a metal, such as a simple metal substance (e.g., Au, Pt, Ag, Cu, or Al), or an alloy containing these substances, is appropriately used. As the projections 471, 472, 481, and 482 are configured of such a metal, it is possible to reduce contact resistance between the wirings 41 and 42, and the fixed electrode portions 38 and 39.

In addition, when the thickness of the wirings 41 to 43 is respectively t, the depth of the part where the wiring 41 of the above-described recessed portions 22 to 24 is provided is respectively d, and the height of the projections 471, 472, 481, and 482 is respectively h, a relationship of d+t+h is satisfied.

In addition, as illustrated in FIGS. 5 and 7, on the wirings 41 to 43, the insulator film 9 is provided. In addition, the insulator film 9 on each of the above-described projections 471, 472, 481, 482, and 50 is not formed, and the surface of the projection is exposed. The insulator film 9 has a function of preventing unintentional electric connection (short circuit) between the conductor pattern 4 and the element piece 3. Accordingly, while reliably preventing unintentional electric connection (short circuit) between the wirings 41 and 42 and other parts, it is possible to electrically connect each of the first fixed electrode fingers 382, 384, 386, 388, 392, 394, 396, and 398 and the wiring 41 to each other, and to electrically connect each of the second fixed electrode fingers 381, 383, 385, 387, 391, 393, 395, and 397 and the wiring 42 to each other. In addition, while more reliably preventing unintentional electrical connection (short circuit) between the wiring 43 and other parts, it is possible to electrically connect the fixing portion 31 and the wiring 43 to each other.

In the embodiment, the insulator film 9 is formed across the substantially entire area of the upper surface of the base substrate 2 excluding a forming area of the projections 471, 472, 481, 482, and 50 which will be described later and the electrodes 44 to 46. In addition, the forming area of the insulator film 9 is not limited thereto if the area covers the wirings 41 and 43. For example, a shape which excludes a connection part of the upper surface of the base substrate 2 with the element piece 3 or with the lid member 5 may be employed.

In addition, when the thickness of the wirings 41 to 43 is respectively t, and the depth of the part where the wiring 41 of the above-described recessed portions 22 to 24 is provided is respectively d, a relationship of d>t is satisfied. Accordingly, for example, as illustrated in FIG. 5, between the fixed electrode finger 391 and the insulator film 9 on the wiring 41, a void 221 is formed. Although not illustrated, a void which is similar to the void 221 is also formed between each of other fixed electrode fingers and the insulator film 9 on the wirings 41 and 42.

In addition, as illustrated in FIG. 7, between the lid member 5 and the insulator film 9 on the wiring 43, a void 222 is formed. Although not illustrated, a void which is similar to the void 222 is also formed between the lid member 5 and the insulator film 9 on the wirings 41 and 42. As these voids, a void which reduces pressure in the lid member 5, or fills the inside with inert gas can be used. In addition, when bonding the lid member 5 and the base substrate 2 with an adhesive, these voids may be blocked by the adhesive.

Configuration materials of the insulator film 9 is not particularly limited, and various materials having insulation properties can be used, but when the base substrate 2 is configured of a glass material (in particular, a glass material to which the alkali metal ion is added), it is preferable to use silicon dioxide ($SiO_2$). Accordingly, it is possible to prevent unintentional electric connection as described above, and to perform anodic bonding between the base substrate 2 and the element piece 3 even when the insulator film 9 is present at the bonding part between the upper surface of the base substrate 2 and the element piece 3.

In addition, the thickness (average thickness) of the insulator film 9 is not particularly limited, but approximately 10 nm to 1000 nm is preferable, and approximately 10 nm to 200 nm is more preferable. When the insulator film 9 having the thickness within such a range is formed, it is possible to prevent unintentional electric connection described above. In addition, when the base substrate 2 is configured of the glass material containing alkali metal ion, and the element piece 3 is configured by using silicon as a main material, even when the insulator film 9 is present at the bonding part between the upper surface of the base substrate 2 and the element piece 3, it is possible to perform the anodic bonding between the base substrate 2 and the element piece 3 via the insulator film 9.

Lid Member

The lid member 5 has a function of protecting the above-described element piece 3.

The lid member 5 has a shape of a plate, and a recessed portion 51 is provided on one surface (lower surface) thereof. The recessed portion 51 is formed to allow displacement of the movable portion 33 and the movable electrode portions 36 and 37 of the element piece 3.

In addition, a part which is closer to the outer side than the recessed portion 51 on the lower surface of the lid member 5 is bonded to the upper surface of the above-described base substrate 2. In the embodiment, the base substrate 2 and the lid member 5 are bonded to each other via the above-described insulator film 9.

A bonding method between the lid member 5 and the base substrate 2 is not particularly limited, and for example, a bonding method using an adhesive, an anodic bonding method, or a direct bonding method can be used.

In addition, the configuration material of the lid member 5 is not particularly limited if the material can achieve the above-described functions. For example, it is possible to appropriately use a silicon material or a glass material.

Second Embodiment

Next, a second embodiment of the physical quantity sensor of the invention will be described.

Figure 8:
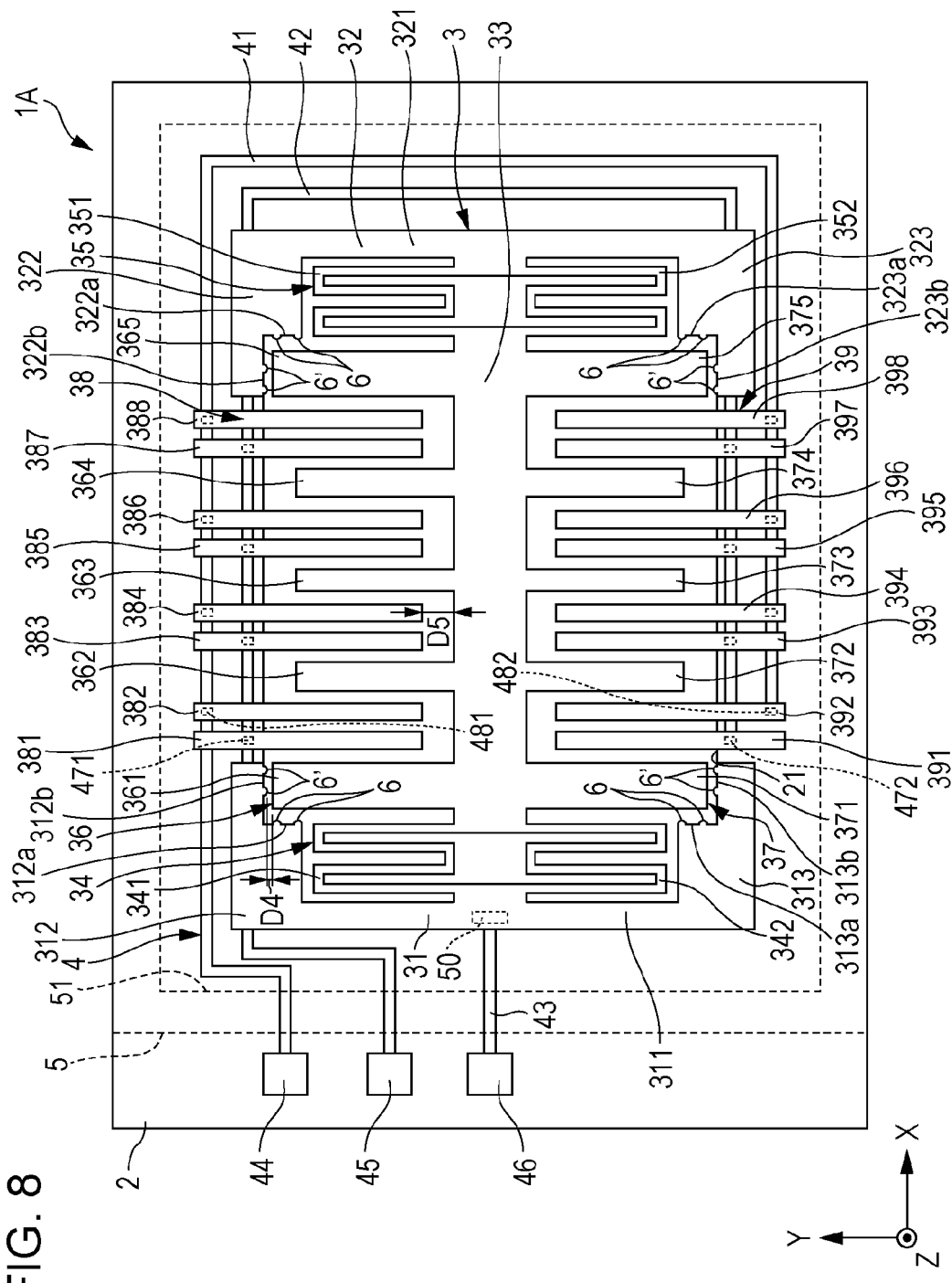
FIG. 8 is a plan view illustrating a physical quantity sensor according to a second embodiment of the invention.

FIG. 8 is a plan view illustrating a physical quantity sensor according to a second embodiment of the invention.

The physical quantity sensor according to the embodiment is similar to the physical quantity sensor according to the above-described first embodiment except that the shapes of the fixing portions 31 and 32 are different, and a decreasing portion 6' is provided.

In addition, in the following description, the physical quantity sensor according to the second embodiment will be described focusing on differences from the above-described embodiment, and description of similar contents will be omitted. In addition, in FIG. 8, configurations which are similar to those of the above-described first embodiment will be given the same reference numerals.

In a physical quantity sensor 1A, the fixing portions 31 and 32 also have a wrapping-around shape on the Y-axis direction side of the movable electrode fingers 361, 365, 371, and 375. In addition, in the fixing portions 31 and 32, the decreasing portion 6' is provided at a part which opposes the movable electrode fingers 361, 365, 371, and 375 in the Y-axis direction.

When describing specifically, the protruded portion 312 of the fixing portion 31 includes a surface 312a which opposes a surface on the −X-axis side of the movable electrode finger 361, and a surface 312b which opposes a surface on the +Y-axis side of the movable electrode finger 361. The decreasing portion 6 which protrudes toward the movable electrode finger 361 is provided on the surface 312a, and the decreasing portion 6' which protrudes toward the movable electrode finger 361 is provided on the surface 312b. In addition, the protruded portion 313 includes a surface 313a which opposes a surface on the −X-axis side of the movable electrode finger 371, and a surface 313b which opposes a surface on the −Y-axis side of the movable electrode finger 371. The decreasing portion 6 which protrudes toward the movable electrode finger 371 is provided on the surface 313a, and the decreasing portion 6' which protrudes toward the movable electrode finger 371 is provided on the surface 313b.

Similarly, the protruded portion 322 of the fixing portion 32 includes a surface 322a which opposes a surface on the +X-axis side of the movable electrode finger 365, and a surface 322b which opposes a surface on the +Y-axis side of the movable electrode finger 365. The decreasing portion 6 which protrudes toward the movable electrode finger 365 is provided on the surface 322a, and the decreasing portion 6' which protrudes toward the movable electrode finger 365 is provided on the surface 322b. In addition, the protruded portion 323 includes a surface 323a which opposes a surface on the +X-axis side of the movable electrode finger 375, and a surface 323b which opposes a surface on the −Y-axis side of the movable electrode finger 375. The decreasing portion 6 which protrudes toward the movable electrode finger 375 is provided on the surface 323a, and the decreasing portion 6' which protrudes toward the movable electrode finger 375 is provided on the surface 323b.

According to this configuration, when an accelerating speed (impact) in the Y-axis direction is applied to the physical quantity sensor 1 and the movable portion 33 is excessively displaced in the Y-axis direction, the movable electrode fingers 361 and 365 strike the decreasing portion 6' of the protruded portions 312 and 322, or the movable electrode fingers 371 and 375 strike the decreasing portion 6' of the protruded portions 313 and 323. For this reason, excessive displacement of the movable portion 33 is restricted, and mechanical strength of the physical quantity sensor 1A becomes excellent.

In particular, in the embodiment, a clearance D4 between the decreasing portion 6' and the movable electrode fingers 361, 365, 371, and 375 becomes smaller than a clearance D5 between the free ends of each fixed electrode finger and the movable portion 33. For this reason, before each of the fixed electrode fingers strike the movable portion 33, the movable electrode fingers 361 and 365 strike the decreasing portion 6', or the movable electrode fingers 371 and 375 strike the decreasing portion 6'. Accordingly, it is possible to effectively prevent damage of the fixed electrode fingers.

According to the physical quantity sensor 1A according to the second embodiment described above, it is also possible to achieve effects similar to those of the physical quantity sensor 1 according to the above-described first embodiment.

Sensor Device

Next, based on FIG. 9, a sensor device which uses the physical sensor of the invention will be described.

Figure 9:
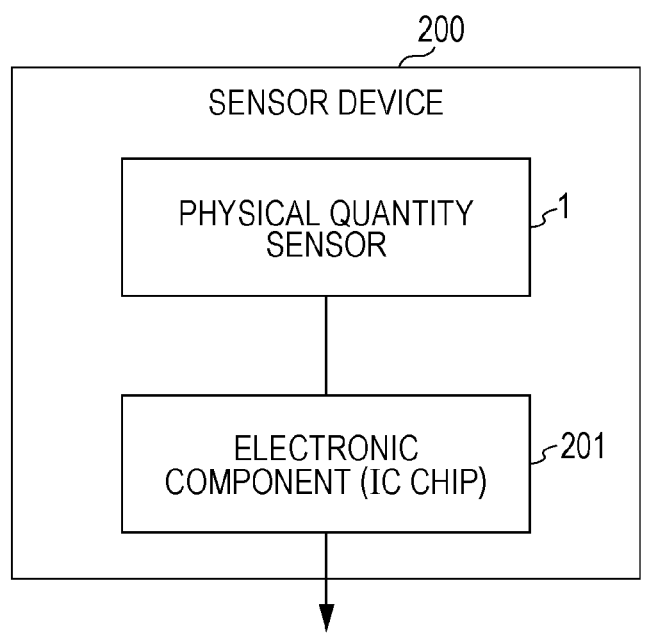
FIG. 9 is a schematic view illustrating a sensor device in which the physical quantity sensor of the invention is employed.

FIG. 9 is a schematic view illustrating a sensor device in which the physical quantity sensor of the invention is employed.

A sensor device 200 illustrated in FIG. 9 includes the above-described physical quantity sensor 1, and an electronic component 201 which is electrically connected to the physical quantity sensor 1.

The electronic component 201 is, for example, an integrated circuit element (IC), and has a function of driving the physical quantity sensor 1. By forming an angular velocity detection circuit or an accelerating velocity detection circuit on the electronic component 201, it is possible to configure the sensor device 200 as a gyro sensor or an acceleration sensor.

In addition, in FIG. 9, a case where the sensor device 200 includes one physical quantity sensor 1 is illustrated, but the sensor device 200 may have a plurality of physical quantity sensors 1. In addition, the sensor device 200 may include the physical quantity sensor 1, and the physical quantity sensor which has a configuration different from that of the physical quantity sensor 1.

Since the physical quantity sensor 1 having excellent sensitivity and impact resistance is provided, the sensor device 200 has excellent reliability.

Electronic Apparatus

Next, an electronic apparatus of the invention will be described.

Figure 10:
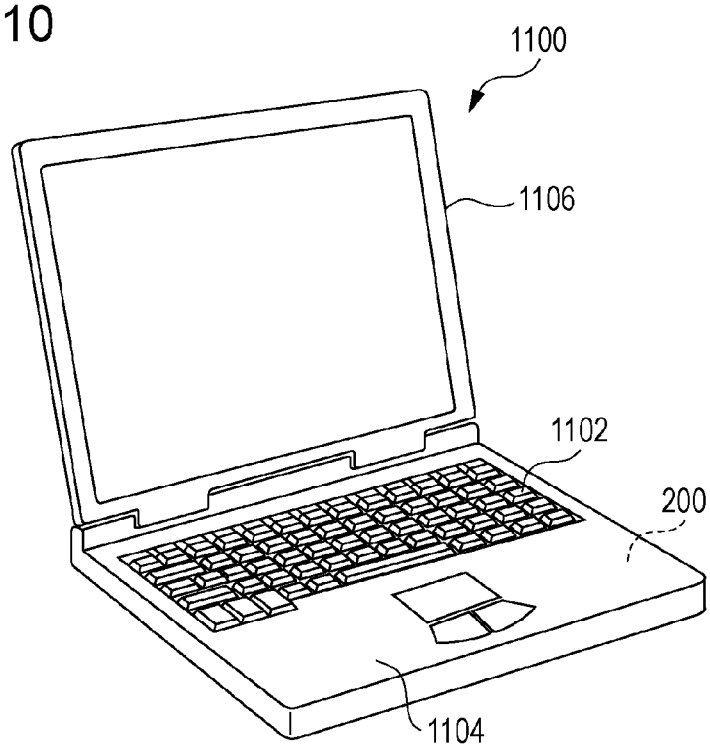
FIG. 10 is an electronic apparatus (note type personal computer) of the invention.

FIG. 10 is an electronic apparatus (note type personal computer) of the invention.

In the drawing, a personal computer 1100 is configured of a main body portion 1104 provided with a keyboard 1102, and a display unit 1106. The display unit 1106 is supported to be rotatable via a hinge structure portion with respect to the main body portion 1104.

In the personal computer 1100, the physical quantity sensor 1 is embedded.

Figure 11:
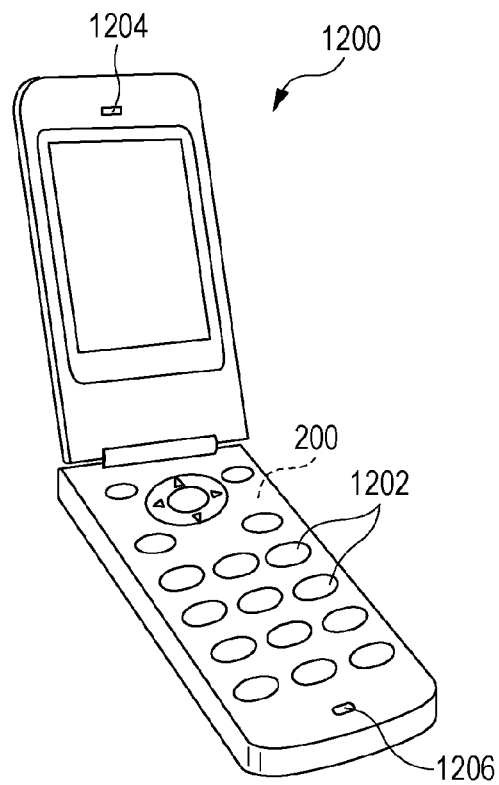
FIG. 11 is an electronic apparatus (mobile phone) of the invention.

FIG. 11 is an electronic apparatus (mobile phone) of the invention.

In the drawing, a mobile phone 1200 includes an antenna (not illustrated), a plurality of operation buttons 1202, an earpiece 1204, and a mouthpiece 1206, and a display portion is disposed between the operation button 1202 and the earpiece 1204.

In the mobile phone 1200, the physical quantity sensor 1 is embedded.

Figure 12:
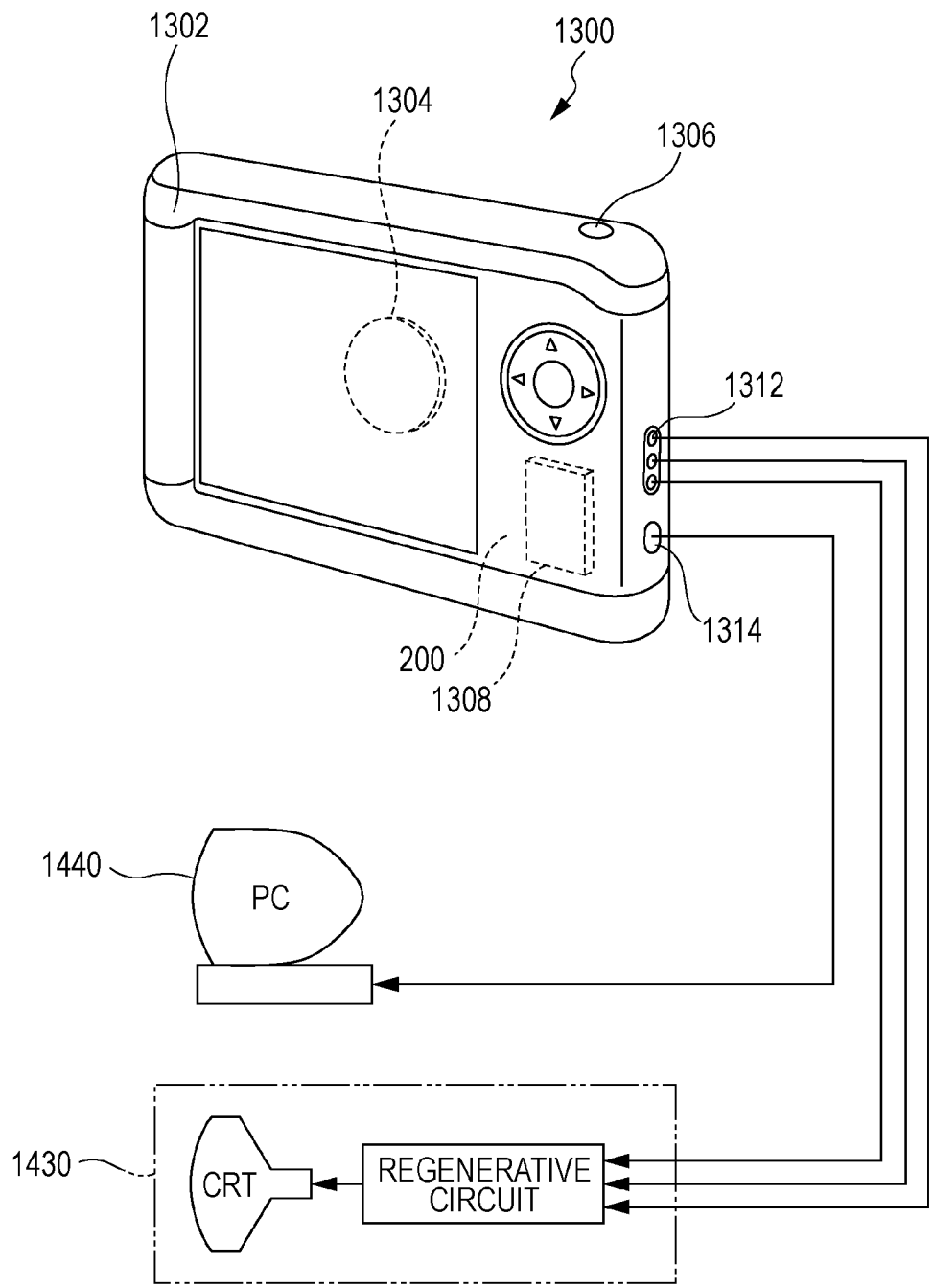
FIG. 12 is an electronic apparatus (digital still camera) of the invention.

FIG. 12 is an electronic apparatus (digital still camera) of the invention. In addition, in the drawing, a connection with an external apparatus is also simply illustrated.

Here, while a silver halide photograph film is exposed by a light image of an object in a normal camera, a digital still camera 1300 performs photoelectric conversion of the light image of the object by an imaging element, such as a charge coupled device (CCD), and generates an imaging signal (image signal).

On a rear surface of a case (body) 1302 in the digital still camera 1300, a display portion is provided, a configuration in which displaying is performed based on the imaging signal by the CCD is employed, and a display portion functions as a finder which displays the object as an electronic image.

In addition, on a front surface side (rear surface side in the drawing) of the case 1302, a light receiving unit 1304 which includes an optical lens (imaging optical system) or the CCD is provided.

When a photographer confirms an object image which is displayed in the display portion, and presses down a shutter button 1306, the imaging signal of the CCD at this time is transferred and stored in a memory 1308.

In addition, in the digital still camera 1300, on a side surface of the case 1302, a video signal output terminal 1312 and an input and output terminal 1314 for data communication are provided. In addition, as illustrated in the drawing, a television monitor 1430 is connected to the video signal output terminal 1312, and a personal computer 1440 is connected to the input and output terminal 1314 for data communication, as necessary. Furthermore, by a predetermined operation, the imaging signal stored in the memory 1308 is configured to be output to the television monitor 1430 or the personal computer 1440.

In the digital still camera 1300, the physical quantity sensor 1 is embedded.

Since the physical quantity sensor 1 having high sensitivity and excellent impact resistance is provided, the electronic apparatus has excellent reliability.

In addition to the personal computer (mobile type personal computer) of FIG. 10, the mobile phone of FIG. 11, and the digital still camera of FIG. 12, examples of the electronic apparatus of the invention include a vehicle posture detection apparatus, a pointing device, a head-mounted display, an ink jet type discharging apparatus (for example, an ink jet printer), a laptop type personal computer, a television, a video camera, a video tape recorder, a navigation apparatus, a pager, an electronic organizer (including an electronic organizer having a communication function), an electronic dictionary, a calculator, an electronic game apparatus, a game controller, a word processor, a work station, a video telephone, a television monitor for preventing crime, an electronic binocular, a POS terminal, a medical apparatus (for example, an electronic thermometer, a sphygmomanometer, a blood sugar meter, an electrocardiographic apparatus, an ultrasonic diagnostic equipment, and an electronic endoscope), a fish finder, various measuring apparatuses, a meters (for example, meters, such as a vehicle meter, an aircraft meter, or a ship meter), and a flight simulator.

Moving Body

Figure 13:
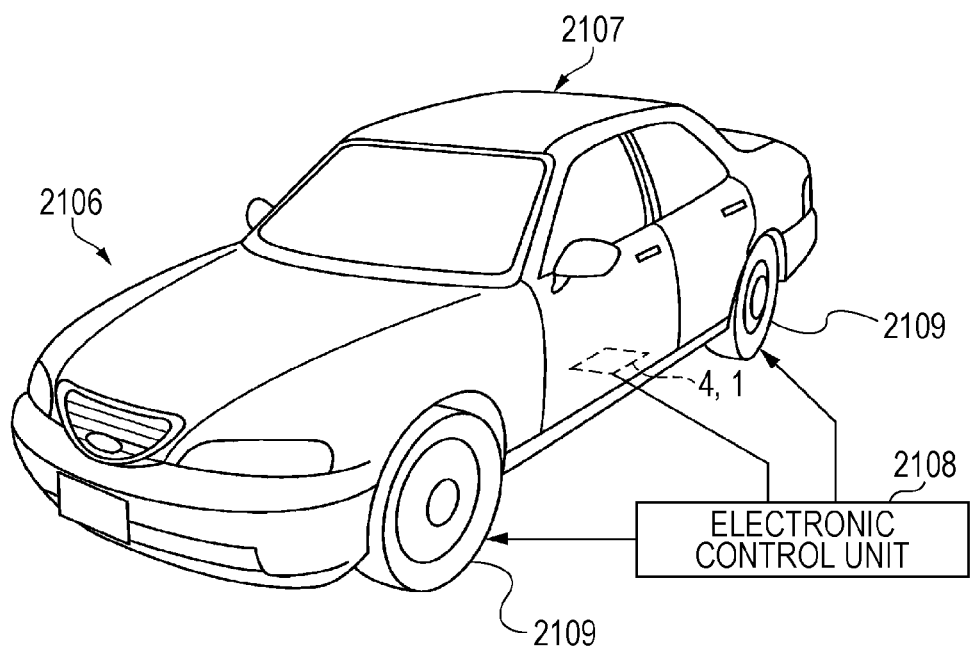
FIG. 13 is a perspective view illustrating a configuration of a vehicle which is an example of a moving body of the invention.

FIG. 13 is an electronic apparatus (vehicle) of the invention.

In the drawing, the physical quantity sensor 1 is embedded in an electronic control unit 2108 which controls a tire 2109, and mounted on a vehicle body 2107.

The physical quantity sensor according to the invention is mounted on a vehicle 2106, and can be widely employed, for example, in the electronic control unit (ECU) 2108, such as a keyless entry, an immobilizer, a car navigation system, a car air conditioner, an antilock brake system (ABS), an airbag, a tire pressure monitoring system (TPMS), an engine controller, a battery monitor of a hybrid vehicle or an electric vehicle, and a vehicle posture control system.

As the physical quantity sensor 1 having high sensitivity and excellent impact resistance is provided, a moving body described above has excellent reliability.

Hereinafter, the physical quantity sensor, the electronic apparatus, and the moving body of the invention are described based on the embodiment illustrated in the drawings, but the invention is not limited thereto.

For example, a fixed electrode portion is not limited to the above-described embodiment, if at least one fixed electrode finger of the plurality of fixed electrode fingers which are aligned in a shape of comb teeth is separated from other fixed electrode fingers on the base substrate.

In addition, the number, the position, and the size of the plurality of fixed electrode fingers of the fixed electrode portion and the plurality of movable electrode fingers of the movable electrode portion provided to mesh with the plurality of fixed electrode fingers, are not limited to the above-described embodiment.

In addition, the movable portion may be configured to be displaceable in the Y-axis direction, and may be configured to rotate the movable portion around an axial line which is parallel to the X axis. In this case, the physical quantity may be detected based on the change in the electrostatic capacity by the change in the opposing area between the movable electrode finger and the fixed electrode finger.

The entire disclosure of Japanese Patent Application Nos. 2014-164907, filed Aug. 13, 2014 and 2015-114927, filed Jun. 5, 2015 are expressly incorporated by reference herein.

What is claimed is:

1. A physical quantity sensor comprising:
a base substrate;
a movable portion which is displaceable in a first direction with respect to the base substrate;
a plurality of movable electrode fingers which are provided on the movable portion and disposed along the first direction, the plurality of movable electrode fingers including a first movable electrode finger and a second movable electrode finger;

a fixed electrode finger which is provided on the base substrate, and disposed to oppose the first movable electrode finger in the first direction; and a fixing portion which fixes the movable portion to the base substrate and is displaceable in the first direction, wherein the second movable electrode finger opposes the fixing portion in the first direction, wherein a clearance between the second movable electrode finger and the fixing portion in the first direction is smaller than a clearance between the first movable electrode finger and the fixed electrode finger in the first direction, and wherein a width of the second movable electrode finger is greater than a width of other movable electrode fingers.

2. The physical quantity sensor according to claim 1,
wherein a part of the fixing portion in the first direction defines a pair of protections that extend toward the second movable electrode finger.

3. The physical quantity sensor according to claim 1,
wherein a width of each of the plurality of movable electrode fingers decreases as a distance from the fixing portion increases.

4. The physical quantity sensor according to claim 1,
wherein one pair of fixing portions are provided to oppose each other in the first direction via the movable portion, and
wherein the movable portion is fixed to the one pair of fixing portions in both end portions in the first direction.

5. The physical quantity sensor according to claim 4,
wherein the second movable finger is located at a terminal end of the movable portion.

6. The physical quantity sensor according to claim 1,
wherein a width of the fixed electrode finger is smaller than the width of the first movable electrode finger.

7. The physical quantity sensor according to claim 1,
wherein a part of the fixing portion defines a pair of projections that extend toward the second movable electrode in a longitudinal direction of the fixing portion.

8. An electronic apparatus comprising:
the physical quantity sensor according to claim 1.

9. An electronic apparatus comprising:
the physical quantity sensor according to claim 2.

10. An electronic apparatus comprising:
the physical quantity sensor according to claim 3.

11. An electronic apparatus comprising:
the physical quantity sensor according to claim 4.

12. An electronic apparatus comprising:
the physical quantity sensor according to claim 5.

13. An electronic apparatus comprising:
the physical quantity sensor according to claim 6.

14. An electronic apparatus comprising:
the physical quantity sensor according to claim 7.

15. A moving body comprising:
the physical quantity sensor according to claim 1.

16. A moving body comprising:
the physical quantity sensor according to claim 2.

17. A moving body comprising:
the physical quantity sensor according to claim 3.

18. A moving body comprising:
the physical quantity sensor according to claim 4.

19. A moving body comprising:
the physical quantity sensor according to claim 5.

20. A moving body comprising:
the physical quantity sensor according to claim 6.

* * * * *